US010107561B2

(12) United States Patent
Inagaki et al.

(10) Patent No.: US 10,107,561 B2
(45) Date of Patent: Oct. 23, 2018

(54) HEAT PIPE

(71) Applicant: Furukawa Electric Co., Ltd., Tokyo (JP)

(72) Inventors: Yoshikatsu Inagaki, Tokyo (JP); Hiroshi Sakai, Tokyo (JP); Hirofumi Aoki, Tokyo (JP); Masanobu Sugimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 672 days.

(21) Appl. No.: 14/504,831

(22) Filed: Oct. 2, 2014

(65) Prior Publication Data
US 2015/0013943 A1  Jan. 15, 2015

Related U.S. Application Data

(63) Continuation of application No. PCT/JP2013/061256, filed on Apr. 16, 2013.

(30) Foreign Application Priority Data

Apr. 16, 2012 (JP) ................................ 2012-092664

(51) Int. Cl.
| F28D 15/04 | (2006.01) |
| F28D 15/02 | (2006.01) |
| H05K 7/20 | (2006.01) |

(52) U.S. Cl.
CPC .......... F28D 15/046 (2013.01); F28D 15/04 (2013.01); F28D 15/02 (2013.01); F28D 15/0233 (2013.01); H05K 7/20 (2013.01)

(58) Field of Classification Search
CPC ...... F28D 15/04; F28D 15/02; F28D 15/0233; F28D 15/046; H01L 24/427; H05K 7/20; F28F 3/022

(Continued)

(56) References Cited

U.S. PATENT DOCUMENTS

2006/0162897 A1 * 7/2006 Cherng ............... F28D 15/0241
  165/46
2007/0114008 A1 * 5/2007 Hou ...................... F28D 15/025
  165/104.26

(Continued)

FOREIGN PATENT DOCUMENTS

| GB | 668270 A * | 3/1952 | .............. F28F 3/022 |
| JP | 2004-198096 A | 7/2004 | |

(Continued)

OTHER PUBLICATIONS

Tian, J., Thermal Hydraulic of Sandwich Structures with Crossed Tube Truss Core and Embedded Heat Pipe, Sep. 25, 2004, University of Virginia, Materials Science Department.*

(Continued)

*Primary Examiner* — Jianying Atkisson
*Assistant Examiner* — Joel Attey
(74) *Attorney, Agent, or Firm* — Oblon, McClelland, Maier & Neustadt, L.L.P.

(57) ABSTRACT

A heat pipe suited for thinning, and achieving high heat transport performance is provided. A heat pipe 1 according to the invention includes working liquid, a container 2 into which the working liquid is sealed, and a mesh member 3 disposed in such a position as to come into contact with at least two inner surfaces of the container, the two surfaces facing to each other. The mesh member 3 is formed by a plurality of meshes 31 and 32 laminated on each other. The porosity in the portion where the respective meshes 31 and 32 contact each other is lower than the porosity in the portion where the meshes 31 and 32 contact the container 2.

5 Claims, 2 Drawing Sheets

(58) Field of Classification Search
USPC .................... 165/104.23, 104.26, 104.33
See application file for complete search history.

(56) References Cited

U.S. PATENT DOCUMENTS

| | | | |
|---|---|---|---|
| 2007/0163755 A1* | 7/2007 | Kim | H01L 23/427 165/104.26 |
| 2007/0240854 A1* | 10/2007 | Liu | F28D 15/046 165/104.26 |
| 2007/0294892 A1 | 12/2007 | Yang et al. | |
| 2009/0321053 A1* | 12/2009 | Tegrotenhuis | F25B 37/00 165/104.26 |
| 2010/0157533 A1 | 6/2010 | Oniki et al. | |
| 2010/0294475 A1* | 11/2010 | Rush | B22F 3/1121 165/185 |
| 2010/0307722 A1* | 12/2010 | Ryoson | F28D 15/0233 165/104.26 |
| 2011/0005724 A1* | 1/2011 | Kasai | B23K 20/02 165/104.21 |
| 2011/0024085 A1* | 2/2011 | Huang | F28D 15/0233 165/104.26 |
| 2011/0088877 A1 | 4/2011 | Oniki et al. | |
| 2011/0253345 A1* | 10/2011 | Ryoson | F28D 15/0233 165/104.26 |
| 2011/0277964 A1* | 11/2011 | Dai | F28D 15/046 165/104.26 |
| 2011/0303392 A1* | 12/2011 | Horiuchi | F28D 15/046 165/104.26 |
| 2012/0031587 A1* | 2/2012 | Huang | F28D 15/046 165/104.26 |
| 2012/0031588 A1* | 2/2012 | Huang | F28D 15/046 165/104.26 |
| 2012/0111539 A1* | 5/2012 | Dai | F28D 15/046 165/104.26 |
| 2013/0014919 A1* | 1/2013 | Dai | F28D 15/046 165/104.26 |
| 2013/0213609 A1* | 8/2013 | Wu | F28D 15/046 165/104.26 |
| 2013/0233520 A1* | 9/2013 | Lo | F28D 15/0233 165/104.26 |

FOREIGN PATENT DOCUMENTS

| | | | |
|---|---|---|---|
| JP | 2009-168326 A | 7/2009 | |
| JP | 2010-151353 A | 7/2010 | |
| JP | 3163111 U | 9/2010 | |
| JP | 2011-075259 A | 4/2011 | |
| JP | 2011-85311 A | 4/2011 | |
| JP | 5075273 | * 12/2011 | ......... F28D 15/0233 |
| KR | 10-2011-0106851 A | 9/2011 | |
| WO | WO 2010/073525 A1 | 7/2010 | |

OTHER PUBLICATIONS

Annamalai, M., Experimental Studies on Porous Wick Flat Plate Heat Pipe, Jul. 2010, Indian Institute of Technology Madras.*
Korean Office Action dated Sep. 18, 2015 in Patent Application No. 10-2014-7026089 (with English language translation).
International Search Report dated Jul. 16, 2013 for PCT/JP2013/061256 Filed on Apr. 16, 2013 (English Language).
JP OA for JP 2014-511219 filed Apr. 16, 2012, dated Jun. 27, 2014.

* cited by examiner

HEAT PIPE

CROSS-REFERENCE TO RELATED APPLICATIONS

This application is a Continuation application of PCT/JP2013/061256, filed Apr. 16, 2013 and is based upon and claiming the benefit of priority from Japanese Patent Application No. 2012-092664, filed Apr. 16, 2012, the entire contents of each are incorporated herein by reference.

TECHNICAL FIELD

The present invention relates to a heat pipe, and more particularly to a heat pipe including the structure of a wick inserted into the heat pipe.

BACKGROUND ART

Recently, development of compact and high-performance electronic devices, including notebook computers as a typical example, is remarkable. Accordingly, there is a strong demand for miniaturization and space-saving of a cooling structure equipped to cool a heating component such as an MPU mounted on such electronic devices. Under these circumstances, it is also demanded to develop a high-performance and thin heat pipe to be included in a cooling structure of this type.

A heat pipe is a component produced by sealing condensable fluid functioning as working liquid into a container such as a closed vacuum-deaerated metal pipe. The heat pipe automatically operates by utilizing temperature differences. The working liquid evaporated in a high-temperature area flows toward a low-temperature area, and releases heat and condenses thereat, so as to transport heat as latent heat of the working liquid.

More specifically, a space functioning as a channel for the working liquid is formed inside the heat pipe. The working liquid contained in that space undergoes phase changes such as evaporation and condensation, and shifts through the space to transfer heat. The working liquid is evaporated on the heat receiving side of the heat pipe by heat of a cooling-target component conducted by heat conduction through the material of the container constituting the heat pipe. The vapor thus produced shifts toward the heat releasing side of the heat pipe. On the heat releasing side, the vapor of the working liquid is cooled and returns to the liquid-phase condition again. The working liquid returned to the liquid-phase condition again shifts (circulates) toward the heat receiving side. Heat transport is achieved by utilizing the phase changes and shift of the working liquid caused by this mechanism.

When the working liquid condensed in the foregoing heat releasing area does not return to the heat receiving area, the operation of the heat pipe does not continue. Accordingly, it is needed that the working liquid condensed in the heat releasing area is rapidly circulated to the heat receiving area. For meeting this necessity, such a method is known which disposes a wick (sheet-shaped wick or wire, for example) capable of producing capillary effect within the container of the heat pipe. Another known method forms fine grooves in the inner wall of the container. Moreover, such a heat pipe is known which contains a laminated mesh member so as to improve the heat transport performance (for example, refer to Patent Literature 1 and Patent Literature 2).

CITATION LIST

Patent Literatures

Patent Literature 1: JP 2010-151353 A
Patent Literature 2: JP 2011-75259 A

SUMMARY OF INVENTION

Technical Problem

According to the heat pipe disclosed in Patent Literature 1 identified above, however, the pressure loss of the vapor flow considerably increases when the heat pipe becomes thinner. In this case, the working liquid does not shift, causing the problem that the heat pipe does not operate. Particularly, when the interior is entirely filled with meshes for maintaining the heat transport performance, the pressure loss of the vapor flow becomes prominent. Furthermore, there is a demand for further improvement over the heat transport performance of the heat pipe disclosed in Patent Literature 2 identified above.

Accordingly, it is an object of the invention to provide a heat pipe suited for thinning, and achieving high heat transport performance.

Solution to Problem

For achieving this object, a heat pipe according to the invention includes: working liquid; a container into which the working liquid is sealed; and a mesh member disposed in such a position as to come into contact with at least two inner surfaces of the container, the two surfaces facing to each other. The mesh member is formed by a plurality of meshes laminated in close contact with each other. At least either thin metallic wires forming the mesh member at least on one of the surfaces where the mesh member contacts the inner side of the container, or thin metallic wires forming the mesh member on the surface where the respective meshes contact each other are crushed in the thickness direction of the mesh member.

Each cross section of the thin metallic wires has a circular shape including a flat part.

According to this application, a mesh corresponds to metallic wire netting.

In the above-described heat pipe, it is preferable that the porosity in the portion where the respective meshes contact each other is lower than the porosity in the portion where the meshes contact the container.

In the above-described heat pipe, it is preferable that the porosity in the portion where the respective meshes contact each other lies in the range from 0.11 to 0.62.

In the above-described heat pipe, it is preferable that a groove is formed in the inner surfaces of the container.

In the above-described heat pipe, it is preferable that the mesh member is disposed in a part of the inside of the container in the width direction of the container, wherein a cavity is formed in the inside of the container.

In the above-described heat pipe, it is preferable that the mesh member is linearly disposed in the longitudinal direction of the container.

Advantageous Effects of Invention

According to the invention, the transmissivity of working liquid is high on the surface of a mesh member, while a capillary force is large inside the mesh member. Accordingly, the working liquid condensed in a heat releasing area can rapidly circulate toward a heat receiving area, wherefore the heat transport performance improves.

BEST MODE FOR CARRYING OUT THE INVENTION

A heat pipe according to the invention includes working liquid, a container, and a mesh member. The working liquid is sealed into the container. The mesh member disposed in such a position as to come into contact with one surface and the other surface of the inner surfaces of the container. The one and the other surfaces of the container face to each other. The mesh member includes a plurality of meshes laminated on each other. The plurality of meshes include a mesh contacting the one surface, and a mesh contacting the other surface. The porosity in the portion where the respective meshes contact each other is lower than the porosity in the portion where the mesh contacting the one surface contacts the one surface or the porosity in the portion where the mesh contacting the other surface contacts the other surface. It is preferable that the porosity in the portion where the plurality of meshes contact each other lies in the range from 0.11 to 0.62.

Another heat pipe according to the invention includes working liquid, a container, and a mesh member. The working liquid is sealed into the container. The mesh member disposed in such a position as to come into contact with one surface and the other surface of the inner surfaces of the container. The one and the other surfaces of the container face to each other. The mesh member is formed by a plurality of meshes laminated in contact with each other. Each of the plurality of meshes is formed by thin metallic wires. The mesh member includes a mesh contacting the one surface, and a mesh contacting the other surface. At least any one of the thin metallic wires included in the portion where the mesh contacting the one surface contacts the one surface, the thin metallic wires included in the portion where the mesh contacting the other surface contacts the other surface, and the thin metallic wires included in the portion where the plurality of meshes contact each other have a part crushed in the thickness direction of the mesh member for each. It is preferable that each of the cross section of the crushed part of the thin metallic wires has a circular shape including a flat part.

It is preferable that a groove is formed in the inner surfaces of the container.

It is preferable that the mesh member is disposed in a part of the inside of the container. In this case, a cavity is formed in the inside of the container.

It is preferable that the mesh member is linearly disposed in the longitudinal direction of the container.

Figure 1:
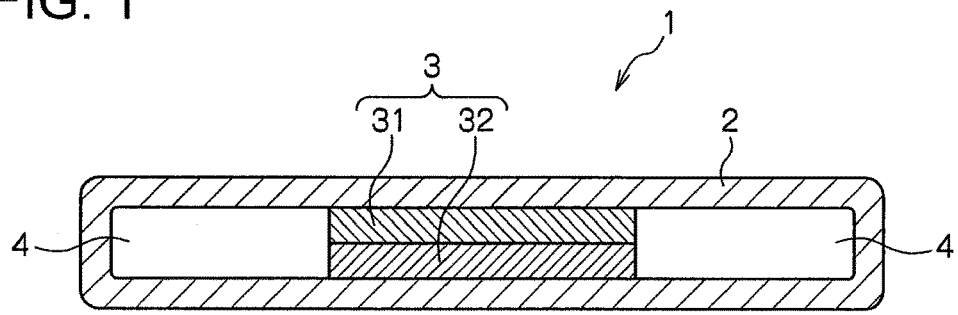
FIG. 1 is a cross-sectional view schematically illustrating the structure of a heat pipe according to an embodiment of the invention.
Figure 2A:
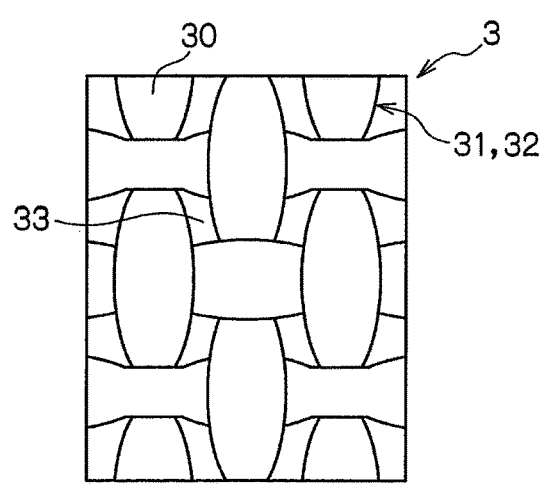
FIG. 2(a) is a plan view schematically illustrating the structure of a mesh member in a portion where the mesh member contacts a container according to the heat pipe of the embodiment of the invention.
Figure 2B:
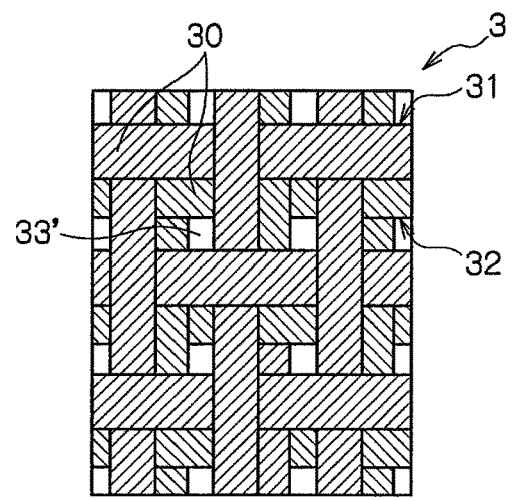
FIG. 2(b) is a plan view schematically illustrating the structure of the mesh member in a portion where a first mesh and a second mesh contact each other according to the heat pipe of the embodiment of the invention.

An embodiment according to the invention is hereinafter described in detail with reference to the drawings. FIG. 1 is a cross-sectional view schematically illustrating the structure of a heat pipe 1 according to the embodiment of the invention. FIG. 2(a) is a plan view schematically illustrating the structure of a mesh member 3 in a portion where the mesh member 3 contacts a container 2 according to the heat pipe 1 of the embodiment of the invention. FIG. 2(b) is a plan view schematically illustrating the structure of the mesh member 3 in a portion where a first mesh 31 and a second mesh 32 contact each other according to the heat pipe 1 of the embodiment of the invention. In FIG. 2(b), the first mesh 31 and the second mesh 32 are hatched in different manners for easy distinction and recognition of the first mesh 31 and the second mesh 32.

As illustrated in FIG. 1, the heat pipe 1 according to the embodiment of the invention is a pipe produced by sealing condensable fluid into the container 2. The condensable fluid, such as pure water and alcohol, functions as working liquid. The container 2 is pipe-shaped and made of metal having excellent heat conductivity, such as copper and copper alloy. The working liquid transports heat by undergoing phase changes. The heat pipe 1 is the flat heat pipe 1 produced by pressing and crushing a cylindrical shaped heat pipe from above and below to flatten the pipe.

The mesh member 3 having a rectangular cross-sectional shape is provided approximately at the center of the container 2 in such a condition as to contact two inner surfaces of the container 2. The two surfaces of the container 2 face to each other. The two surfaces facing to each other inside the container 2 correspond to the upper inner wall surface and the lower inner wall surface of the container 2 as viewed in FIG. 1. The mesh member 3 is linearly disposed in the not-shown longitudinal direction of the container 2.

The mesh member 3 is sandwiched between the upper inner wall surface and the lower inner wall surface of the container 2. The upper surface of the mesh member 3 closely contacts the upper inner wall surface of the container 2 for fixation thereto, while the lower surface of the mesh member 3 closely contacts the lower inner wall surface of the container 2 for fixation thereto. A cavity 4 is formed between one side surface of the mesh member 3 and the inner wall of the container 2, and between the other side surface of the mesh member 3 and the inner wall of the container 2 for each.

In addition to the mesh member 3, fine grooves (not shown) may be formed in the inner wall of the container 2 to allow the working liquid condensed in a heat releasing area to rapidly circulate toward a heat receiving area.

The mesh member 3 includes the first mesh 31 and the second mesh 32 laminated on each other with press-contact to come into a condition affixed to each other with close contact therebetween. Each of the first mesh 31 and the second mesh 32 is made of copper, phosphor bronze, aluminum, silver, stainless steel, molybdenum, or alloy of these materials, for example. The mesh member 3 may be formed by laminating two sheets of mesh, or by folding one sheet of mesh and laminating the folded parts. Two or a larger number of sheets of mesh may be laminated.

As illustrated in FIG. 2(a), thin metallic wires 30 constituting the mesh member 3 and located on the surface of the mesh member 3 where the mesh member 3 contacts the inside of the container 2 are crushed in the thickness direction of the mesh member 3. On the other hand, as illustrated in FIG. 2(b), the thin metallic wires 30 constituting the mesh member 3 and located on the surface of the mesh member 3 where the first mesh 31 and second mesh 32 contact each other are not crushed. According to the mesh member 3 discussed herein, only the mesh member contacting any one surface of the inner surfaces of the container may be crushed in the thickness direction, or both of the mesh member contacting one and the other inner opposed surfaces of the container, respectively, may be crushed in the thickness direction.

It is preferable that each of the thin metallic wires 30 crushed in the thickness direction of the mesh member 3 has a circular cross-sectional shape including a flat part, that is, a so-called semi-cylindrical shape only on the surface of the mesh member 3 where the mesh member 3 contacts the inside of the container 2.

As illustrated in FIG. 2(a), there are formed pores 33 between the crushed thin metallic wires 30 in each of the portion of the first mesh 31 where the first mesh 31 contacts the container 2, and the portion of the second mesh 32 where the second mesh 32 contacts the container 2. Moreover, as illustrated in FIG. 2(b), under the condition of the first mesh 31 and the second mesh 32 affixed to each other with press-contact, there are formed pores 33' in the portion where the first mesh 31 and the second mesh 32 contact each other. The pores 33' are produced by overlapping of the pores between the thin metallic wires 30 of the first mesh 31 and the pores between the thin metallic wires 30 of the second mesh 32 and/or the thin metallic wires 30 of the first mesh 31 and the thin metallic wires 30 of the second mesh 32.

The effective pore radius in the portion where the first mesh 31 and the second mesh 32 of the mesh member 3 contact each other is smaller than the effective pore radius of each of the first mesh 31 and the second mesh 32. On the other hand, under the condition in which the respective meshes are only overlapped with each other, the effective pore radius of each of the meshes does not vary. More specifically, when an effective pore radius r and a thickness d of mesh, a number N of sheets of mesh to be overlapped, and a thickness d' of the mesh member 3 after lamination and press-contact are assumed, an effective pore radius r' in the portion where a mesh and another mesh contact each other after lamination and press-contact is determined by an equation r'=d'/(Nd)×r. When meshes are only overlapped with each other, d'=Nd holds. In this case, the effective pore radius does not vary. However, after the step of press-contact, this relation becomes d'<Nd, in which condition the effective pore radius decreases. As a consequence, the capillary pressure improves.

The porosity in the portion where the first mesh 31 and the second mesh 32 contact each other is lower than each porosity in the portion where the first mesh 31 contacts the container 2 and in the portion where the second mesh 32 contacts the container 2. The porosity in the portion where the first mesh 31 and the second mesh 32 contact each other is not required to be lower than each of these porosities, but may be only lower than either the porosity in the portion where the first mesh 31 contacts the container 2 or the porosity in the portion where the second mesh 32 contacts the container 2.

The porosity in this context is a ratio of the pores 33 and 33' to the meshes 31 and 32. More specifically, the porosity is calculated by the following method.

(Porosity in Portion of Contact Between Mesh and Container 2)

The first mesh 31 and the second mesh 32 are laminated and deformed with press-contact, and then separated from each other to produce one sheet mesh. An area $Sh_1$ of the pore 33 is calculated from an image of the surface of the mesh contacting the container 2, that is, the surface where the thin metallic wires 30 are crushed. This image is obtained by using SEM (scanning electron microscope). Based on the calculated portion $Sh_1$, a porosity $\varepsilon_1$ in the portion where the mesh contacts the container 2 is calculated by using the following equation (1).

[Mathematical Formula 1]

$$\text{Porosity } \varepsilon_1 = Sh_1/S \tag{1}$$

In this equation, S corresponds to the area of the mesh.

(Porosity in Portion of Contact Between Respective Meshes)

A porosity $\varepsilon_2$ in the portion where the respective meshes contact each other is calculated by the following equation (2).

[Mathematical Formula 2]

$$\text{Porosity } \varepsilon_2 = Vh_2/V_2 \tag{2}$$

In this equation, $Vh_2$ corresponds to the volume of the pore 33' in the portion where the respective meshes contact each other, while $V_2$ is the volume of the mesh in the portion where the respective meshes contact each other. The value $V_2$ is calculated by measuring the height of the portion where the respective meshes contact each other, and integrating the height by the area S of the mesh. The value $Vh_2$ is calculated by the following equation (3). The portion where the respective meshes contact each other in this context refers to an portion where the respective meshes overlap with each other with the lower surface of the first mesh 31 (top of mesh) entering the clearances of the second mesh 32 and with the lower surface of the second mesh 32 (top of mesh) entering the clearances of the first mesh 31, that is, the portion where the respective meshes overlap with each other while cutting into the opposite meshes. This portion is recognized by observing a cross section of the mesh member 3 cut in the thickness direction thereof.

[Mathematical Formula 3]

$$Vh_2 = Vh - Vh_1 \tag{3}$$

In this equation, $Vh_1$ corresponds the volume of the pore where the respective meshes do not contact each other, and is calculated by the following equation (4). The value Vh corresponds to the volume of the pore in the whole mesh member 3, and is calculated by the following equation (5).

[Mathematical Formula 4]

$$Vh_1 = \varepsilon_1 \times V_1 \tag{4}$$

In this equation, $V_1$ corresponds to the volume of the mesh where the respective meshes do not contact each other, and is calculated by measuring the height of the portion where the respective meshes of the mesh member 3 do not contact each other, and integrating the height by the area S of the mesh. In this context, the portion where the respective meshes do not each other refers to the portion of the mesh member 3 other than the portion where the respective meshes contact each other.

[Mathematical Formula 5]

$$Vh = \varepsilon \times V \tag{5}$$

In this equation, $\varepsilon$ corresponds to the porosity of the whole mesh member 3, and is calculated by the following equation (6). The value V corresponds to the volume of the whole mesh member 3, and is calculated by measuring the height of the mesh member 3 and integrating the height by the area S of the mesh.

[Mathematical Formula 6]

$$\varepsilon = 1 - \rho_{mesh}/\rho_{cu} \qquad (6)$$

In this equation, $\rho_{mesh}$ corresponds to the density of the mesh member 3, and is calculated by measuring the weight of the whole mesh member 3 and dividing the weight by the whole mesh volume V. The value $\rho_{cu}$ corresponds to the density of the material of the thin metallic wires 30 constituting the mesh member 3.

It is preferable that each porosity of the first mesh 31 and the second mesh 32 after lamination and press-contact in the portions where the first and second meshes 31 and 32 contact the container 2 lies in the range from 0.4 to 0.9, and the porosity in the portion where the respective meshes 31 and 32 contact each other lies in the range from 0.11 to 0.62 by appropriate selection of the first mesh 31 and the second mesh 32.

According to the heat pipe 1 in this embodiment, a not-shown heating component is thermally connected with a lower part of the container 2 at one end thereof (heat receiving area), and positioned thereat.

The heat generated from the heating component conducts through the material of the container 2, and evaporates the working liquid within the container 2. The evaporated working liquid flows through the cavities 4 and shifts toward the heat releasing side. Simultaneously, a part of the heat conducted through the material of the container 2 passes through the mesh member 3, and shifts from the lower side to the upper side of the container 2, that is, from the side contacting the heating component toward the wall surface on the opposite side. Accordingly, the heat effectively diffuses toward the opposite side wall surface of the container 2. The working liquid having released the heat in the heat releasing area returns to the liquid phase, and passes through the mesh member 3 having a large capillary force, and rapidly circulates toward the heat receiving side.

In general, the condition having a large capillary force corresponds to the condition having a small capillary radius. This condition produces a resistance to the working liquid, wherefore the transmissivity of the working liquid becomes low. Accordingly, when the porosity of the whole mesh member 3 is decreased to raise the capillary force, the amount of the working liquid allowed to be introduced becomes smaller, in which condition the heat transport performance deteriorates. Accordingly, the method of decreasing the porosity of the whole mesh member 3 for improving the heat transport performance produces only a limited effect.

According to the heat pipe 1 in the embodiment of the invention, however, the porosity in the portion where the first mesh 31 and the second mesh 32 contact each other is lower than each porosity in the portion where the first mesh 31 contacts the container 2 and in the portion where the second mesh 32 contacts the container 2. In this case, the capillary force inside the mesh member 3 increases while maintaining the transmissivity on the surfaces of the mesh member 3. Accordingly, the large capillary force thus produced inside the mesh member 3 allows rapid spread of the working liquid throughout the inside of the mesh member 3, while a large amount of the working liquid is introduced through the surfaces of the mesh member 3. As a result, the heat transport performance improves.

A manufacturing method of the heat pipe 1 according to the embodiment of the invention is now described. Initially, a lamination of the first mesh 31 and the second mesh 32 is produced by folding a sheet-shaped mesh or by overlapping a plurality of sheet-shaped meshes. The laminated first and second meshes 31 and 32 are pressurized in the up-down direction to produce the mesh member 3. This pressurization is continued not only until the meshes of the first mesh 31 and the second mesh 32 become dense by compression, but until the first mesh 31 and the second mesh 32 are affixed to each other with press-contact while forming a semi-cylindrical cross-sectional shape of each of the thin metallic wires 30 constituting the first mesh 31 and the second mesh 32. For obtaining the porosity in the range from 0.11 to 0.62 in the portion where the respective meshes contact each other, pressurization is executed such that the compression rate of the meshes lies in the range from 0.25 to 0.6, for example. In this context, the compression rate is defined by (thickness of mesh after compression)/(thickness of mesh before compression).

In the subsequent step, the interior of the cavity 4 of the cylindrical container original pipe is cleaned, and the mesh member 3 is inserted into the container original pipe. Simultaneously, an appropriate amount of working liquid is injected. After deaeration, both ends of the container 2 are sealed by welding to produce a heat pipe. Thereafter, the heat pipe is flattened to produce the flat heat pipe 1. The flattening process may be performed prior to the step for producing a heat pipe.

According to this embodiment, the mesh member 3 is arranged in a part inside the container 2 in the width direction thereof. However, the mesh member 3 may be provided in the entire area inside the container 2 in the width direction. Generally, when the mesh member 3 is disposed in a path corresponding to the vapor channel, the pressure loss of the vapor flow becomes excessively large. In this case, the working liquid does not shift, wherefore the heat pipe 1 does not operate. According to the embodiment of the invention of this application, however, the first mesh 31 and the second mesh 32 are laminated on each other with press-contact. Accordingly, a high capillary pressure capable of overcoming a large vapor pressure loss is produced, wherefore the heat transport performance improves. Moreover, since the first mesh 31 and the second mesh 32 are laminated on each other with press-contact, the pore radius inside the mesh member 3 decreases. Accordingly, a force retaining the working liquid within the meshes increases, in which condition the working liquid on the interface between the gaseous phase and the liquid phase is difficult to be scattered by vapor.

According to the structure of this embodiment, the thin metallic wires 30 constituting the mesh member 3 on the surface where the mesh member 3 contacts the inside of the container 2 are crushed, while the thin metallic wires 30 constituting the mesh member 3 on the surface where the first mesh 31 and the second mesh 32 contact each other are not crushed. However, it is only required that the thickness of the mesh member 3 is reduced by press contact. More specifically, the thin metallic wires 30 constituting the mesh member 3 on the surface where the first mesh 31 and the second mesh 32 contact each other may be crushed, or the thin metallic wires 30 constituting the mesh member 3 both on the surface where the mesh member 3 contacts the inside of the container 2 and on the surface where the first mesh 31 and the second mesh 32 contact each other may be crushed.

Example

The invention is hereinafter described in more detail based on the following examples. However, the invention is not limited to these examples.

A heat pipe was manufactured by the following method, and the performance of the heat pipe was evaluated.

Manufacture of Heat Pipe

Example 1

Two sheets of sheet-shaped mesh made of copper and having a mesh slit width of 2 mm were overlapped, and pressurized in the direction perpendicular to the sheet plane with press-contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.6, while the porosity in the portion where the respective meshes contact each other was 0.2. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 2

Two sheets of sheet-shaped mesh made of copper and having a mesh slit width of 2 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.16. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 3

Two sheets of sheet-shaped mesh made of copper and having a mesh slit width of 2 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.39. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 4

Two sheets of sheet-shaped mesh made of copper and having a mesh slit width of 3.5 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.16. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 5

Two sheets of sheet-shaped mesh made of copper and having a mesh slit width of 3.5 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.39. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 6

Two sheets of sheet-shaped mesh made of copper and having a mesh slit width of 2 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.58. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 7

Two sheets of sheet-shaped mesh made of copper and having a mesh slit width of 2 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.44. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 8

Two sheets of sheet-shaped mesh made of copper and having a mesh slit width of 3.5 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.58. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 9

Two sheets of sheet-shaped mesh made of copper and having a mesh slit width of 3.5 mm were overlapped, and pressurized in the direction perpendicular to the sheet plane with press contact to produce a mesh member in the size of 100 mm×75 mm. By the press-contact step, the two sheets of mesh were affixed to each other, that is, bonded to each other in such a condition as to be inseparable from each other unless a separating force is applied. The porosity in the portion where the mesh contacts the container was 0.66, while the porosity in the portion where the respective meshes contact each other was 0.44. Then, the two sheets of mesh were sandwiched between two copper sheets in the size of 110 mm×80 mm, and an appropriate amount of working liquid was injected. After deaeration, the end of the container was sealed by welding to produce a flat heat pipe having a thickness of 0.5 mm.

Example 10

The same as Example 1 except that the porosity in the portion where the respective meshes contact each other was set to 0.62.

Example 11

The same as Example 3 except that the porosity in the portion where the respective meshes contact each other was set to 0.62.

Example 12

The same as Example 3 except that the porosity in the portion where the respective meshes contact each other was set to 0.20.

Example 13

The same as Example 1 except that the porosity in the portion where the respective meshes contact each other was set to 0.11.

Comparative Example 1

A flat heat pipe is manufactured in the same condition as that of Example 1 except that only one sheet of sheet-shaped mesh was used.

Comparative Example 2

A flat heat pipe was manufactured in the same condition as that of Comparative Example 1 except that the mesh slit width was 3.5 mm.

Comparative Example 3

A flat heat pipe was manufactured in the same condition as that of Example 1 except that the sheet-shaped mesh in the condition of only one sheet was compressed.

Comparative Example 4

The same as Example 1 except that the porosity in the portion where the respective meshes contact each other was set to 0.08.

Comparative Example 5

The same as Example 2 except that the sheet-shaped meshes are not compressed, and that the resultant porosity in the portion where the respective meshes contact each other was 0.66.

Comparative Example 6

The same as Example 3 except that the sheet-shaped meshes are not compressed, and that the resultant porosity in the portion where the respective meshes contact each other was 0.66.

(Performance Evaluation Test)

Figure 3:
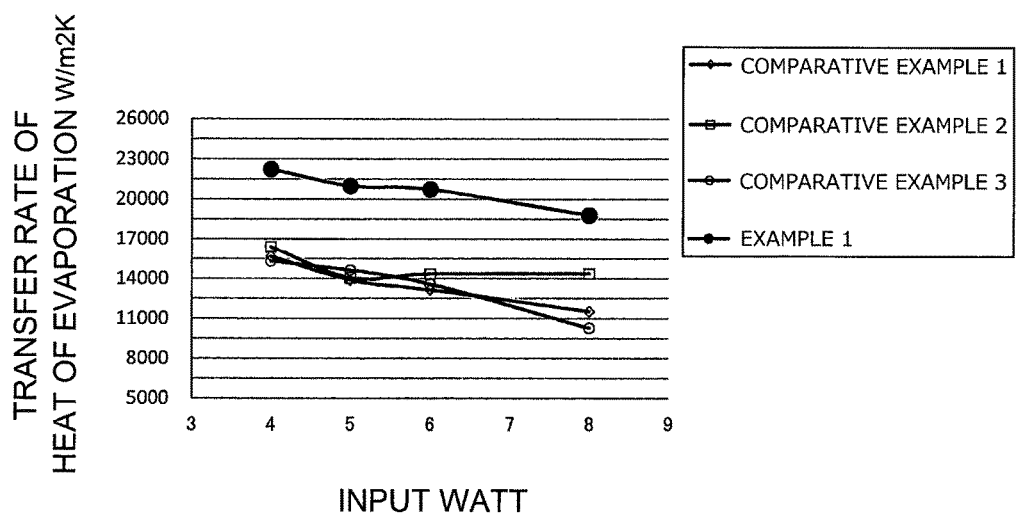
FIG. 3 is a graph showing the heat transport performance of the heat pipe according to the embodiment of the invention.

A heat source in the range from 4 W to 8 W was connected to the lower surface of each of the heat pipes according to Examples and Comparative Examples shown herein, and the transfer rate of heat of evaporation was calculated under control of the heat releasing area such that the operation temperature of the heat pipe was maintained at 50° C. The transfer rate of heat of evaporation is expressed as 1/((heat source temperature−heat entrance position temperature)/quantity of heat)/area. The results of the calculation are shown in FIG. 3.

Setting the maximum heat transport amount in the case not performing the press-contact step at 100%, the maximum heat transport amount was evaluated for each of Examples 1 through 13 and Comparative Examples 4 through 6. When the maximum heat transport amount was 110% or higher, ⊙ was given. When the maximum heat transport amount was larger than 100% and smaller than 110%, ○ was given. When the maximum heat transport amount was 100% or smaller, Δ was given. The results of these evaluations are shown in Tables 1 and 2.

TABLE 1

| | Example 1 | Example 2 | Example 3 | Example 4 | Example 5 | Example 6 | Example 7 | Example 8 |
|---|---|---|---|---|---|---|---|---|
| Mesh Shape | 2 mm Width | 2 mm Width | 2 mm Width | 3.5 mm Width | 3.5 mm Width | 2 mm Width | 2 mm Width | 3.5 mm Width |

TABLE 1-continued

|  | Example 1 | Example 2 | Example 3 | Example 4 | Example 5 | Example 6 | Example 7 | Example 8 |
|---|---|---|---|---|---|---|---|---|
| Porosity (Deep Portion) | 0.20 | 0.16 | 0.39 | 0.16 | 0.39 | 0.58 | 0.44 | 0.58 |
| Maximum Heat transport Amount (W) | 8.22 | 7.63 | 7.59 | 6.23 | 7.87 | 6.3 | 7.27 | 6.73 |
| Performance Improvement Rate | 146% | 136% | 135% | 111% | 140% | 112% | 129% | 120% |
| Evaluation | ⊙ | ⊙ | ⊙ | ⊙ | ⊙ | ⊙ | ⊙ | ⊙ |

TABLE 2

|  | Example 9 | Example 10 | Example 11 | Example 12 | Example 13 | Comparative Example 4 | Comparative Example 5 | Comparative Example 6 |
|---|---|---|---|---|---|---|---|---|
| Mesh Shape | 3.5 mm Width | 2 mm Width | 3.5 mm Width | 3.5 mm Width | 2 mm Width | 2 mm Width | 2 mm Width | 3.5 mm Width |
| Porosity (Deep Portion) | 0.44 | 0.62 | 0.62 | 0.20 | 0.11 | 0.08 | 0.66 | 0.66 |
| Maximum Heat transport Amount (W) | 7.73 | 5.94 | 6.22 | 6.89 | 6.59 | 5.63 | 5.63 | 5.63 |
| Performance Improvement Rate | 137% | 106% | 110% | 122% | 117% | 100% | 100% | 100% |
| Evaluation | ⊙ | ○ | ○ | ⊙ | ⊙ | Δ | Δ | Δ |

As apparent from FIG. 3 and Tables 1 and 2, the heat pipe according to each of the examples obtained excellent characteristics through compressed deformation of the meshes. On the other hand, the heat pipe according to each of the Comparative Examples had poor characteristics.

DESCRIPTION OF REFERENCE NUMERALS AND SIGNS

1: HEAT PIPE
2: CONTAINER
3: MESH MEMBER
30: THIN METALLIC WIRE
31: FIRST MESH
32: SECOND MESH
33, 33': PORE
4: CAVITY

The invention claimed is:

1. A heat pipe, comprising:
   working liquid;
   a container into which the working liquid is sealed; and
   a mesh member disposed in such a position as to come into contact with at least two inner surfaces of the container, the two surfaces facing to each other,
   wherein the mesh member is formed by a plurality of meshes laminated in contact with each other, and by metallic wires, forming the mesh member on, at least, one of the two surfaces where the mesh member contacts the inner side of the container, that are modified in the thickness direction of the mesh member with each cross section of the respective metallic wires having a semi-circular shape with a flat part,
   wherein the mesh member is formed by a plurality of meshes, each formed by alternately intersecting the metallic wires vertically and horizontally, pressed against each other,
   wherein in each of the plurality of meshes, a first pore radius in a portion where the plurality of meshes contact each other is smaller than a second pore radius of a remaining portion of the respective mesh,
   wherein the first pore radius is r' and is determined from an equation r'=d'/(Nd)*r and d'<Nd is required after pressing the plurality of meshes,
   where d is a thickness of the remaining portion of the respective mesh, N is a total number of the plurality of meshes, d' is a thickness of the mesh member after lamination and pressure welding, and r is the second pore radius,
   wherein a porosity of a portion where the mesh member, after pressing the plurality of meshes, contacts the container is 0.4 to 0.9,
   wherein the porosity in the portion where the respective meshes contact each other is lower than the porosity in the portion where the meshes contact the container, and
   wherein the porosity in the portion where the respective meshes contact each other lies in the range from 0.11 to 0.62.

2. The heat pipe according to claim 1, wherein a groove is formed in the inner surfaces of the container.

3. The heat pipe according to claim 1, wherein the mesh member is disposed in a part of the inside of the container in the width direction of the container, wherein a cavity is formed in the inside of the container.

4. The heat pipe according to claim 1, wherein the mesh member is linearly disposed in the longitudinal direction of the container.

5. A heat pipe, comprising:
   working liquid;
   a container into which the working liquid is sealed; and
   a mesh member disposed in such a position as to come into contact with at least two inner surfaces of the container, the two surfaces facing to each other, wherein the mesh member is formed by a plurality of meshes laminated in contact with each other, and by metallic wires, forming the mesh member on a surface where the respective meshes contact each other, that are modified in the thickness direction of the mesh member with each cross section of the respective metallic wires having a semi-circular shape with a flat part, wherein the mesh member is formed by a plurality of meshes, each formed by alternately intersecting the metallic wires vertically and horizontally, pressed against each other, wherein in each of the plurality of meshes, a first pore radius in a portion where the plurality of meshes contact each other is smaller than a second pore radius of a remaining portion of the respective mesh, wherein the first pore radius is $r'$ and is determined from an equation $r'=d'/(Nd)*r$ and $d'<Nd$ is required after pressing the plurality of meshes, where $d$ is a thickness of the remaining portion of the respective mesh, $N$ is a total number of the plurality of meshes, $d'$ is a thickness of the mesh member after lamination and pressure welding, and $r$ is the second pore radius, wherein a porosity of a portion where the mesh member, after pressing the plurality of meshes, contacts the container is 0.4 to 0.9, wherein the porosity in the portion where the respective meshes contact each other is lower than the porosity in the portion where the meshes contact the container, and wherein the porosity in the portion where the respective meshes contact each other lies in the range from 0.11 to 0.62.

* * * * *